310-322
10/26/82 OR 4,356,422 SR

United States Patent [19]

van Maanen

[11] 4,356,422

[45] Oct. 26, 1982

[54] ACOUSTIC TRANSDUCER

[75] Inventor: Gerardus A. van Maanen, Eindhoven, Netherlands

[73] Assignee: U.S. Philips Corporation, New York, N.Y.

[21] Appl. No.: 155,698

[22] Filed: Jun. 2, 1980

[30] Foreign Application Priority Data

Jun. 25, 1979 [NL] Netherlands ........................ 7904924

[51] Int. Cl.[3] .......................................... H01L 41/10

[52] U.S. Cl. .................................. 310/322; 310/334; 310/800

[58] Field of Search .................. 73/624, 644; 310/321, 310/322, 325-327, 332, 334, 336, 364, 365, 800; 367/152, 141, 170

[56] References Cited

U.S. PATENT DOCUMENTS

| | | | |
|---|---|---|---|
| 3,004,424 | 10/1961 | Henry | 73/67.8 |
| 3,798,473 | 3/1974 | Murayama et al. | 310/334 |
| 4,096,756 | 6/1978 | Alphonse | 310/334 |

*Primary Examiner*—A. T. Grimley
*Assistant Examiner*—D. L. Rebsch
*Attorney, Agent, or Firm*—Robert T. Mayer; Bernard Franzblau

[57] ABSTRACT

An acoustic transducer comprising a transmitter consisting of a plate of piezoelectric ceramic material and a pair of electrodes and an adaptation layer which comprises a receiver consisting of a layer of piezoelectric or ferroelectric polymer material with a pair of electrodes. As a result, optimum operation of the transducer is possible during transmission as well as during reception.

10 Claims, 2 Drawing Figures

ACOUSTIC TRANSDUCER

The invention relates to an acoustic transducer comprising a transmitter which is formed by a plate which is made of a piezoelectric ceramic material and which comprises electrodes, one side of said plate being covered with an adaptation layer of a thickness amounting to approximately one quarter of the wavelength of sound at the resonance frequency of the plate.

Transducers of this kind are used, for example, in ultrasonic examination devices (echography), for medical and maritime applications, and for materials testing. The adaptation layer serves to adapt the transmitter to the medium (for example, water or oil) in which the object to be examined is present or to the object itself in order to ensure a satisfactory transfer of energy (for example, see German Offenlegungsschrift No. 25 37 788).

In the known transducers of this kind, after the transmission of an acoustic pulse, the transmitter is connected as a receiver in order to detect the echo from the object to be examined. This method offers the advantage that a single transducer suffices for transmission as well as reception. It is a drawback, however, that even though the piezoelectric ceramic material is very suitable for transmission, it has less favourable properties for reception.

The invention has for an object to provide a transducer which operates very well during transmission as well as during reception. To this end, the transducer in accordance with the invention is characterized in that the adaptation layer comprises a receiver in the form of a layer of a piezoelectric or ferroelectric polymer material, said receiver also comprising electrodes.

The invention is based on the recognition of the fact that a piezoelectric or ferroelectric polymer material has very favourable properties for reception and, moreover, can very well form a part of the adaptation layer during transmission.

It is to be noted that U.S. Pat. No. 3,004,424 describes an acoustic transducer which comprises a separate transmitter and a separate receiver which are separated by a layer of a material having such a thickness that the delay time of acoustic waves therein exceeds the delay time in the medium to be examined. This is definitely not an adaption layer and the transmitter as well as the receiver consist of piezoelectric crystals. A preferred embodiment of the transducer in accordance with the invention, which can be comparatively simply manufactured, is characterized in that the entire adaptation layer is formed by the receiver.

The invention will be described in detail hereinafter with reference to the accompanying diagrammatic drawing in which.

Figure 1:
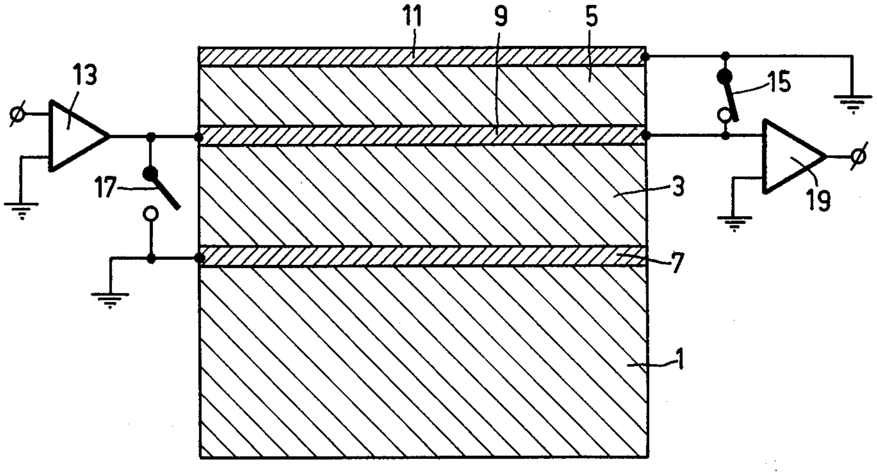
FIG. 1 is a cross-sectional view of a first embodiment.

The acoustic transducer which is diagrammatically shown in FIG. 1 (not to scale) consists of a substrate 1 of epoxy resin with a suitable filler on which there is provided a transmitter 3, and on top thereof a receiver 5. The transmitter 3 consists of a plate of a piezoelectric ceramic material (for example, lead zirconate titanate), a first electrode 7 being provided on its lower side and on its upper side a second electrode 9. These electrodes are formed by a thin metal layer, for example, a silver layer.

The receiver 5 consists of a layer of piezoelectric or ferroelectric polymer material, for example, polyvinylidene fluoride (PVDF) in the $\beta$ or $\gamma$ modification. This layer also comprises two electrodes. The first electrode, being situated on the lower side of the receiver 5, may be identical to the second electrode 9 of the transmitter 3, as shown in the drawing. The second electrode 11 of the receiver 5 consists of a metal layer on the upper side of the polymer layer. If desired, obviously, the first electrode of the receiver may also be formed by a separate layer provided on the polymer.

The thickness of the receiver 5 equals one quarter of the wavelength of sound at the frequency emitted by the transmitter 3. The receiver 5 thus also forms an adaptation layer to ensure suitable energy transfer from the transmitter 3 to a liquid medium (not shown), for example, water or oil.

During the transmission of an ultrasonic pulse, a suitable voltage is briefly applied, via an amplifier 13, between the electrodes 7 and 9 of the transmitter 3. To this end, the input of the amplifier 13 is connected to a pulse generator (not shown), its output being connected to the electrode 9. During the transmission, the receiver 5 is electrically short-circuited in that a switch 15 inserted between the electrodes 9 and 11 is closed.

At the end of the transmission pulse, the switch 15 is opened and a second switch 17 is closed so that the transmitter 3 is electrically short-circuited and acoustic waves which are reflected by the object to be examined and which are incident on the receiver 5 produce an output voltage between the electrodes 9 and 11. This output voltage can be applied, via an amplifier 19, to a display device (not shown).

Figure 2:
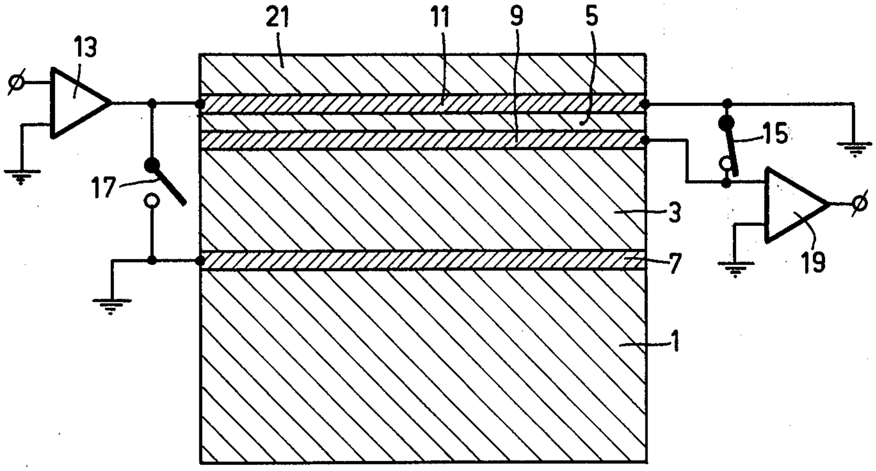
FIG. 2 is a cross-sectional view of a second embodiment.

FIG. 2 shows (again diagrammatically and not to scale) a second embodiment with corresponding parts being denoted by the same reference numerals as used in FIG. 1. The difference with respect to the embodiment shown in FIG. 1 consists in that the receiver 5 is thinner than the value corresponding to one quarter wavelength. In order to achieve suitable adaptation of the transmitter 3 to the medium, a further layer 21 which consists of, for example, a filled epoxy resin is provided on the electrode 11. The thickness of the further layer 21 is chosen so that the layers 5 and 21 together have a thickness of approximately one quarter wavelength. The provision of such a further layer 21 may sometimes be necessary because some piezoelectric polymers are not available in a thickness which is sufficient to form a layer of one quarter wavelength. The receiver 5 can then be composed of a suitable number of thin layers of piezoelectric polymer, or the solution shown in FIG. 2 may be chosen. For simplicity of the manufacturing process, however, the embodiment shown in FIG. 1 will often be preferred.

What is claimed is:

1. An acoustic transducer, comprising a transmitter including a plate of piezoelectric ceramic material having electrodes on opposite surfaces, one side of said plate being covered with an adaptation layer of a thickness approximately one quarter of the wave-length of sound at the resonance frequency of the plate, said adaptation layer comprising a receiver including a layer of piezoelectric or ferroelectric polymer material having a pair of electrodes on opposite surfaces thereof.

2. A transducer as claimed in claim 1, characterized in that the entire adaptation layer is formed by the receiver.

3. A transducer as claimed in claim 1 or 2, characterized in that the polymer material of the receiver is polyvinylidene fluoride.

4. An electroacoustic transducer comprising, a first layer of piezoelectric ceramic material having electrodes on opposite surfaces thereof for coupling said layer to a source of electric energy thereby to generate acoustic wave energy for propagation into a liquid medium, an adaptation layer covering one surface of said first layer and having a thickness approximately one quarter wave-length of acoustic wave energy at the resonance frequency of said first layer and located so that acoustic wave energy generated by said first layer propagates through the adaptation layer in its passage to the liquid medium, and wherein said adaptation layer includes at least one layer of a material chosen from the group of materials consisting of piezoelectric polymer materials and ferroelectric polymer materials, said one polymer layer having electrode means thereby to derive an electric energy output in response to acoustic wave energy received via the liquid medium.

5. A transducer as claimed in claim 4 wherein said one polymer layer has said thickness of approximately one quarter wave-length and is arranged in contiguous relationship to the first layer with at least one electrode sandwiched therebetween, said one polymer layer comprising the entire adaptation layer.

6. A transducer as claimed in claim 4 wherein said adaptation layer includes said one polymer layer of a thickness less than one quarter wave-length of said acoustic wave energy and at least one further layer of acoustic wave energy propagation material adjacent thereto and a thicknes such that the combined thicknesses of the one polymer layer and the at least one further layer together equal one quarter wave-length of said acoustic wave energy, said transducer being arranged in a multi-layered sandwich configuration.

7. A transducer as claimed in claims 4, 5 or 6 further comprising first and second switch means coupled across the electrodes of the first layer and the electrode means of the one polymer layer, respectively, said switch means being operated so that the first switch means is open when the second switch means is closed, and vice versa.

8. A transducer as claimed in claim 6 wherein said one further layer comprises a filled epoxy resin.

9. A transducer as claimed in claims 4, 5 or 6 further comprising a substrate which is contiguous to said first layer and supports the transducer layers to form a multi-layered sandwich arrangement.

10. A transducer as claimed in claims 4, 5, 6 or 8 wherein said polymer material of said one layer comprises polyvinylidene fluoride.

* * * * *